(12) United States Patent
Hsieh et al.

(10) Patent No.: US 9,240,315 B1
(45) Date of Patent: Jan. 19, 2016

(54) CVD OXIDE SURFACE PRE-CONDITIONING BY INDUCTIVELY COUPLED O2 PLASMA

(71) Applicant: Applied Materials, Inc., Santa Clara, CA (US)

(72) Inventors: Ping Han Hsieh, San Jose, CA (US); Teng-Fang Kuo, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/512,312

(22) Filed: Oct. 10, 2014

(51) Int. Cl.
H01L 21/02 (2006.01)

(52) U.S. Cl.
CPC .... *H01L 21/02164* (2013.01); *H01L 21/02238* (2013.01); *H01L 21/02315* (2013.01); *H01L 21/02334* (2013.01)

(58) Field of Classification Search
None
See application file for complete search history.

(56) References Cited

U.S. PATENT DOCUMENTS

| 7,786,016 | B2 | 8/2010 | Sinha et al. | |
|---|---|---|---|---|
| 7,955,510 | B2 | 6/2011 | Arghavani et al. | |
| 8,252,194 | B2 | 8/2012 | Kiehlbauch et al. | |
| 2009/0137094 | A1* | 5/2009 | Lee | H01L 21/76224 438/424 |
| 2010/0311240 | A1* | 12/2010 | Masuda | H01L 21/02074 438/674 |

* cited by examiner

*Primary Examiner* — Yasser A Abdelaziez
(74) *Attorney, Agent, or Firm* — Patterson & Sheridan, LLP

(57) ABSTRACT

A method and apparatus for conditioning an oxide surface during a semiconductor device formation process is provided herein. One or more plasma processing operations are performed on a substrate having a fin structure and shallow trench isolation structure (STI) formed thereon. An oxygen containing plasma process may modify surfaces of the STI structure in preparation for an argon containing plasma process. The argon containing plasma process may form a first layer on the fin structure and STI structure and an ammonia fluoride containing plasma process may form a second layer on the first layer. The first and second layers may be removed from the substrate during a subsequent heating process to provide a cleaned fin structure suitable for subsequent processing operations.

20 Claims, 3 Drawing Sheets

CVD OXIDE SURFACE PRE-CONDITIONING BY INDUCTIVELY COUPLED O2 PLASMA

BACKGROUND

1. Field

Embodiments of the present disclosure generally relate to methods and apparatus for forming a semiconductor device. More specifically, embodiments described herein relate to a chemical vapor deposition (CVD) oxide surface preconditioning process.

2. Description of the Related Art

In semiconductor fabrication, oxide fabrication is critical, especially for thin layer oxides which is an essential part of gate structure for Complimentary Metal Oxide Semiconductor (CMOS) technology. With proper manufacturing control, oxide layers exhibit stable and desirable dielectric properties. A variety of oxide fabrication processes are used in integrated device manufacturing (IDM) to obtain oxides of different properties for different functions. Thermal oxides and deposited oxides are most commonly used in semiconductor devices. Additionally, native oxides may be generated during processing. Different oxides may also respond differently to subsequent processes and may require different treatment for the same purpose.

A native oxide typically forms when a substrate surface is exposed to oxygen. Oxygen exposure occurs when substrates are moved between processing chambers at atmospheric conditions, or when a small amount of oxygen remains in a vacuum chamber. Native oxides may also result from contamination during etching processes. Native oxides are typically undesirable and need to be removed prior to a subsequent processing.

During semiconductor fabrication, structures may be formed with excess material and then etched and/or polished back to a desired dimension. For oxide features, polishing and etching are generally used after formation to reach a desired size. Some oxide features may have two or more oxides that respond differently to the same process, hence posing difficulties in processing, especially at advanced technology nodes, such as sub-10 nm nodes.

Shallow Trench Isolation (STI) is one of the oxide structures that have several forms of oxides. STI is a form of device isolation technology used for sub-0.25 micron fabrication. Oxide filled trenches are used to isolate devices formed on a semiconductor substrate. Trenches are first etched on a semiconductor substrate, followed by growth or deposition of an oxide layer. A chemical mechanical polishing (CMP) process may be performed on the oxide filled trench after deposition, followed by an etching process to prepare the trench and other structures on the substrate for the subsequent process, such as various well implants, gate oxidation, deposition, and patterning.

Sputter etching processes and wet etching processes are conventional oxide etching processed used in STI etching. However, sputter etching processes generally cannot completely remove oxides and can damage delicate silicon layers by physical bombardment. Wet etching utilizes chemical solutions, for example hydrofluoric acid (HF) and deionized water, to remove oxides. However, diluted HF has the disadvantage of having a variable oxide etch rate. Various types of oxides have varying etch rates depending on the type of etching process utilized. Thus, significant variability and integration issues may persist when removing oxides.

Moreover, maintaining desired critical dimensions of features formed on the substrate is important to manufacture defect free semiconductor devices. Various oxide etching processes may not be suitable for maintaining necessary critical dimension which may lead to an excess degree of critical dimension increase, or blow-out. Further, various etching processes may not provide substrate surfaces for subsequent processing operations.

Therefore, there is a need for apparatus and methods for conditioning and cleaning substrate and oxide features formed on a substrate.

SUMMARY

In one embodiment, a method for forming a semiconductor device is provided. The method includes transferring a substrate in to a plasma processing chamber. The substrate may have a fin structure and a shallow trench isolation structure formed thereon. The substrate may be exposed to an oxygen containing plasma, an argon containing plasma, and an ammonia fluoride containing plasma. The substrate may also be heated and a reaction product from exposing the substrate to the argon plasma and the ammonia fluoride plasma may be removed from the substrate.

In another embodiment, a method for forming a semiconductor device is provided. The method includes transferring a substrate in to a plasma processing chamber. The substrate may have a silicon fin structure and a shallow trench isolation oxide structure formed thereon. The substrate may be exposed to an oxygen containing plasma to form oxygen terminated surfaces on the shallow trench isolation oxide structure. The substrate may be exposed to an argon containing plasma to form a modified layer on the substrate and the substrate may be exposed to an ammonia fluoride containing plasma to form a reaction product layer. The substrate may be heated and the reaction product layer may be removed from the substrate.

In yet another embodiment, a method for forming a semiconductor device is provided. The method includes transferring a substrate in to a plasma processing chamber. The substrate may have a fin structure and a shallow trench isolation structure formed thereon. The substrate may be exposed to a first plasma to modify surfaces of the shallow trench isolation structure. The substrate may also be exposed to a second plasma different from the first plasma to form a first layer on the substrate and the substrate may be exposed to a third plasma different from the first and second plasmas to form a second layer on the first layer. The substrate may be heated and the first layer and second layer may be removed.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

A method and apparatus for conditioning an oxide surface during a semiconductor device formation process is provided herein. One or more plasma processing operations are performed on a substrate having a fin structure and shallow trench isolation structure (STI) formed thereon. An oxygen containing plasma process may modify surfaces of the STI structure in preparation for an argon containing plasma process. The argon containing plasma process may form a first layer on the fin structure and STI structure and an ammonia fluoride containing plasma process may form a second layer on the first layer. The first and second layers may be removed from the substrate during a subsequent heating process to provide a cleaned fin structure suitable for subsequent processing operations.

Figure 1:
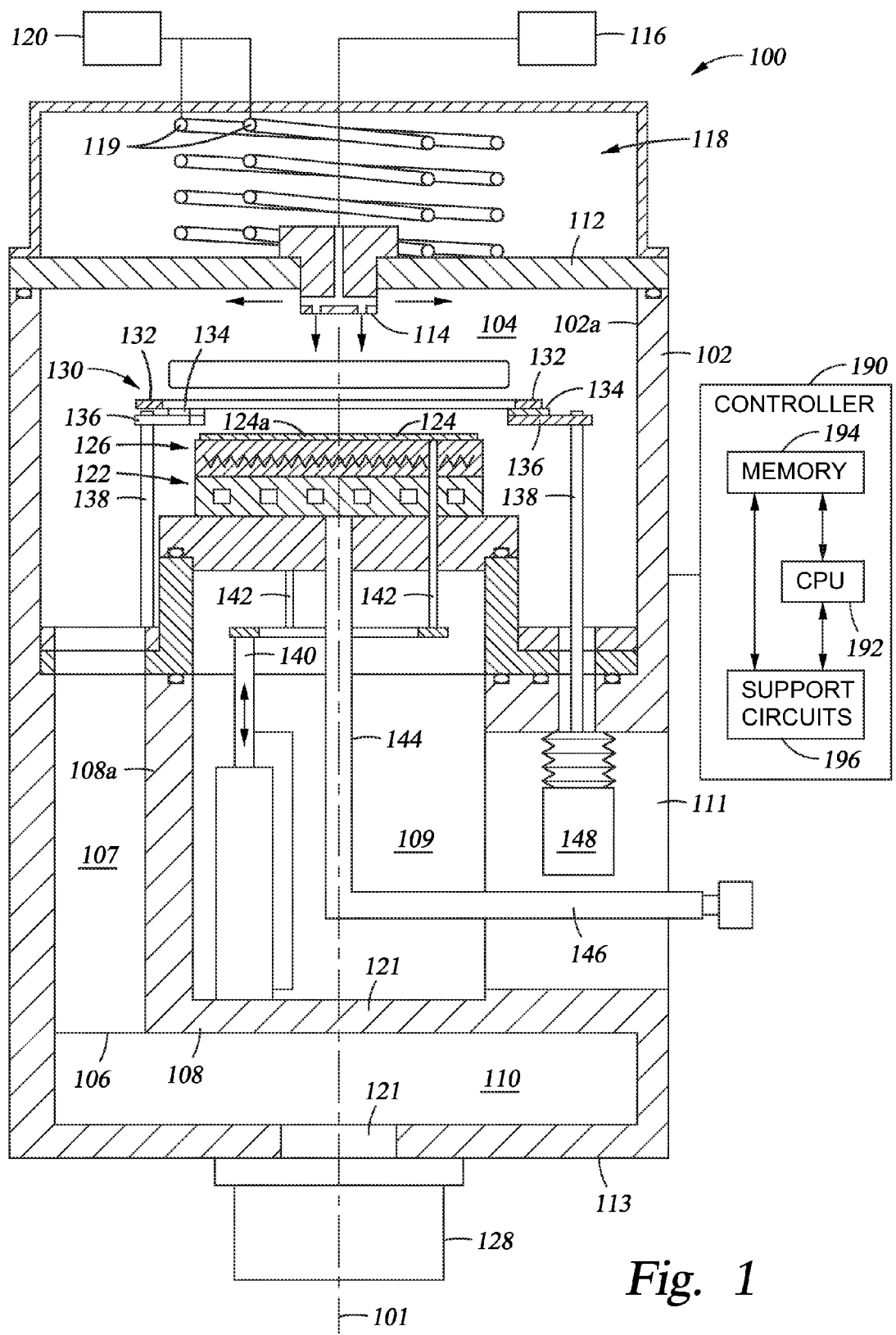
FIG. 1 illustrates a schematic, cross-sectional view of a processing apparatus within which embodiments of the disclosure may be performed.

FIG. 1 illustrates a schematic, cross-sectional view of a plasma processing chamber 100 within which embodiments of the disclosure may be performed. One example of a plasma processing chamber within which embodiments of the disclosure may be implemented is the CENTRIS™ ADVANTEDGE MESA etching chamber available from Applied Materials, Inc., Santa Clara, Calif. It is contemplated that other systems and chambers from other manufacturers may also be utilized to perform the methods described herein.

The plasma processing chamber 100 includes a chamber body 102. A basin 108 is disposed within the chamber body 102 and connected to the chamber body through a plurality of spokes 106. The basin 108 and the plurality of spokes 106 are symmetrically positioned about a central axis 101 of the chamber body 102. Each spoke 106 may be hollow with an inner passage 111. The plurality of spokes 106 may be evenly distributed along sidewalls 108a of the basin 108. The basin 108 and the plurality of spokes 106 divide the interior of the chamber body 102 to a processing volume 104 in the upper portion and an evacuation volume 110 in the lower portion. The processing volume 104 and the evacuation volume 110 are connected by a plurality of vertical volumes 107 between the plurality of spokes 106.

A substrate support assembly 122 is disposed in the chamber body 102 over the basin 108. The substrate support assembly 122 is configured to support a substrate 124 while the substrate 124 is being processed in the processing volume 104. The substrate support assembly 122 may have a substrate supporting plane 124a positioned to be symmetric about the central axis 101.

The substrate support assembly 122 isolates a basin volume 109 from processing volume 104 and the evacuation volume 110. The basin volume 109 may be connected to the exterior of the chamber body 102 through the inner passages 111 of the plurality of spokes 106. A lift pin assembly 140 may be disposed in the basin volume 109 for moving lift pins 142 to raise or lower the substrate 124. A shaft 144 in the basin volume 109 and a duct 146 connected to the shaft 144 through the inner passage 111 of the spokes 106 may be used to house connections to the substrate support assembly 122, such as leads to an embedded heater, leads to an electrode, conduits for circulating cooling fluid, and the like.

A plasma generator 118 may be disposed over a lid 112 of the chamber body 102. A gas distribution nozzle 114 may be positioned through the lid 112 to deliver one or more processing gases to the processing volume 104. The gas distribution nozzle 114 may be connected to a gas panel 116. The plasma generator 118 is positioned to ignite and maintain a plasma within the processing volume 104. The plasma generator 118 may be an inductively coupled plasma source having one or more coils 119 connected to a radio frequency (RF) power source 120. In one embodiment, the plasma generator 118 and the gas distribution nozzle 114 may be symmetrically positioned about the central axis 101.

A vacuum port 121 may be formed through a bottom 113 of the chamber body 102. The vacuum port 121 may be symmetric about the central axis 101. A pumping system 128 may be coupled to the vacuum port 121 to maintain a low pressure environment in the plasma processing chamber 100. The symmetrically arranged gas distribution nozzle 114, substrate support assembly 122, basin 108, spokes 106, and vacuum port 121 facilitate a substantially symmetrical flow paths within the plasma processing chamber 100.

The plasma processing chamber 100 further includes a plasma tuning assembly 130 configured to adjusting plasma distribution within the processing volume 104. The plasma tuning assembly 130 may include a conductive ring 132 disposed about an edge region 126 of the substrate support assembly 122. In one embodiment, the conductive ring 132 may be positioned between an inner wall 102a of the chamber body 102 and the edge region 126 of the substrate support assembly 122 and horizontally above the substrate 124 supported by the substrate support assembly 122. The conductive ring 132 forms one continuous conductive body. The conductive ring 132 may be a unitary ring or multiple ring sections electrically connected to one another.

The plasma tuning assembly 130 further includes a support assembly for positioning the conductive ring 132 in the plasma processing chamber 100. In one embodiment, the support assembly may include a plurality of supporting fingers 136 extending from a plurality of supporting posts 138. The conductive ring 132 is supported by the plurality of supporting fingers 136. An electrical insulator 134 may be disposed between the conductive ring 132 and each of the supporting fingers 136 so that the conductive ring 132 electrically floats in the processing volume 104 without electrical contact with any elements in the plasma processing chamber 100. During plasma processing, the RF field propagated from the plasma generator 118 may generate an electrical current within the closed loop of the conductive ring 132, resulting an electric potential in the conductive ring 132. The electrical potential in the conductive ring 132 alters the plasma cloud in the processing volume 104 and tunes the plasma. The continuous conductive ring 132 may shift the plasma cloud equally at the edge region 126.

The conductive ring 132 may move relative to the substrate support assembly 122 shifting the plasma cloud to a target direction. Each of the supporting posts 138 may be connected to an actuator 148 and the actuator 148 may move the supporting post 138 vertically (parallel with the central axis 101) and/or horizontally (perpendicular to the central axis 101).

The plurality of supporting posts 138 may be moved in unison vertically and/or horizontally. The conductive ring 132 may be supported in a plane substantially parallel to the substrate supporting plane 124a. The vertical movement of the conductive ring 132 may be used to adjust a degree of influence of the conductive ring 132 to the plasma around the edge region 126. The horizontal movement of the conductive ring 132 may be used to adjust the symmetry of the plasma cloud.

Alternatively, each of the supporting posts 138 may be independent. For example, each of the supporting posts 138 may be moved independently along the vertical direction so that the conductive ring 132 may be tilted relative to a substrate supporting plane 124a resulting in a variable adjustment along the periphery of the substrate support assembly 122 that can be used to compensate for non-symmetry in the plasma.

The conductive ring 132 is formed from an electrically conductive material, such as a metal material. For example, the conductive ring 132 may be formed from aluminum, copper, stainless steel, and alloys and combinations thereof. In one embodiment, the conductive ring 132 may have a protective coating to prevent any attack from processing plasma. The protective coating may be a ceramic coating. In one embodiment, the protective coating may be a yttria material coating. The supporting posts 138 and the supporting fingers 136 may be formed from anodized aluminum. The insulator 134 may be formed from a polymer, such as TORLON®, a ceramic, or anodized aluminum.

The plasma tuning assembly 130 may include components positioned substantially symmetrical about the central axis 101 to further improve chamber symmetry. Each of the plurality of supporting posts 138 may extend through the plurality of spokes 106. The actuators 148 may be disposed in the inner passages 111 of the spokes 106.

The plasma tuning assembly 130 of the plasma processing chamber 100 passively generates an electrical potential for plasma tuning. Alternatively, the electrical potential of a plasma assembly may be actively controlled by connecting a conductive body inside the plasma processing chamber 100 with control circuits. For example, a control circuit including a variable capacitance may be used to actively adjust the electrical potential of the conductive body inside the plasma chamber.

The above-described processing chamber 100 can be controlled by a processor based system controller such a controller 190. For example, the controller 190 may be configured to control flow of various process gases and purge gases from gas sources, during different stages of a substrate process sequence. The controller 190 includes a programmable central processing unit (CPU) 192 that is operable with a memory 194 and a mass storage device, an input control unit, and a display unit (not shown), such as power supplies, clocks, cache, input/output (I/O) circuits, and the like, coupled to the various components of the processing chamber 101 to facilitate control of the substrate processing. The controller 190 also includes hardware for monitoring substrate processing through sensors in the processing chamber 100, including sensors monitoring the process gas and purge gas flow. Other sensors that measure system parameters such as substrate temperature, chamber atmosphere pressure and the like, may also provide information to the controller 190.

To facilitate control of the processing chamber 100 described above, the CPU 192 may be one of any form of general purpose computer processor that can be used in an industrial setting, such as a programmable logic controller (PLC), for controlling various chambers and sub-processors. The memory 194 is coupled to the CPU 192 and the memory 194 is non-transitory and may be one or more of readily available memory such as random access memory (RAM), read only memory (ROM), floppy disk drive, hard disk, or any other form of digital storage, local or remote. Support circuits 196 are coupled to the CPU 192 for supporting the processor in a conventional manner. Etching and other processes are generally stored in the memory 194, typically as a software routine. The software routine may also be stored and/or executed by a second CPU (not shown) that is remotely located from the hardware being controlled by the CPU 192.

The memory 194 is in the form of computer-readable storage media that contains instructions, that when executed by the CPU 192, facilitates the operation of the processing chamber 100. The instructions in the memory 194 are in the form of a program product such as a program that implements the method of the present disclosure. The program code may conform to any one of a number of different programming languages. In one example, the disclosure may be implemented as a program product stored on computer-readable storage media for use with a computer system. The program(s) of the program product define functions of the embodiments (including the methods described herein). Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored. Such computer-readable storage media, when carrying computer-readable instructions that direct the functions of the methods described herein, are embodiments of the present disclosure.

The process chamber 100 is particularly useful for performing one or more plasma assisted dry etching processes without breaking vacuum. In one embodiment, the process chamber 100 may be utilized to modify or remove one or more oxides disposed on the substrate. An exemplary dry etch process for modifying or removing one or more oxides may utilize a variety of process gases, such as oxygen ($O_2$), argon (Ar), ammonia ($NH_3$), and nitrogen trifluoride ($NF_3$), among others. The dry etching processes may be performed within the process chamber 100 and it is believed the methods described below may benefit from plasma treatment in addition to substrate heating within a single process environment.

Figure 2:
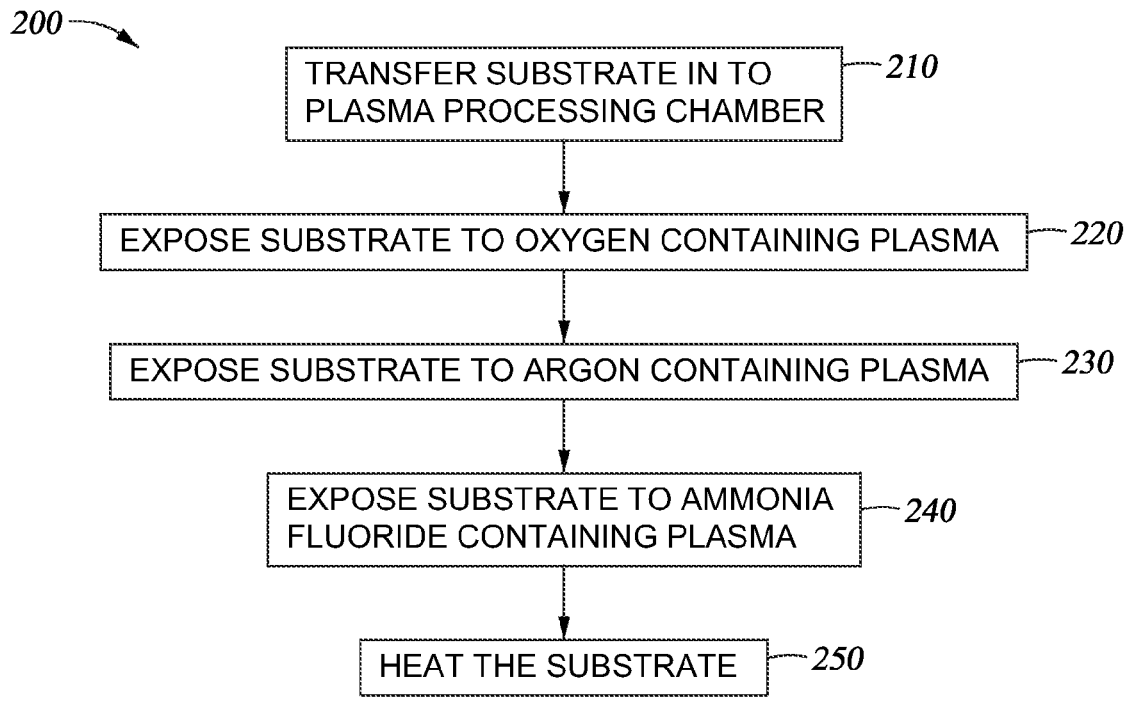
FIG. 2 illustrates operations of a method.

FIG. 2 illustrates operations of a method 200 according to embodiments of the present disclosure. At operation 210, a substrate is transferred to a plasma processing chamber, such as the processing chamber 100. The transferring typically occurs in an atmospheric environment between two vacuum environments. Generally, a native oxide may form on certain materials of the substrate due to atmospheric exposure. At operation 220, the substrate may be exposed to an oxygen containing plasma. The oxygen containing plasma may modify various surfaces or materials disposed on the substrate. At operation 230, the substrate may be exposed to an argon containing plasma. The argon containing plasma may also modify surfaces or material disposed on the substrate.

At operation 240, the substrate may be exposed to an ammonia fluoride containing plasma. The ammonia fluoride containing plasma may selectively deposit a layer of material on desired surfaces of the substrate. At operation 250, the substrate may be heated. The heating of the substrate may remove desired material from the substrate via a desorption process. The operations 210-250 of the method 200 may be performed sequentially in certain embodiments and concurrently in other embodiments. It is also contemplated that other operations may be performed in conjunction with the operations 210-250. The operations 210-250 will be described in greater detail with reference to FIGS. 3-6.

Figure 3:
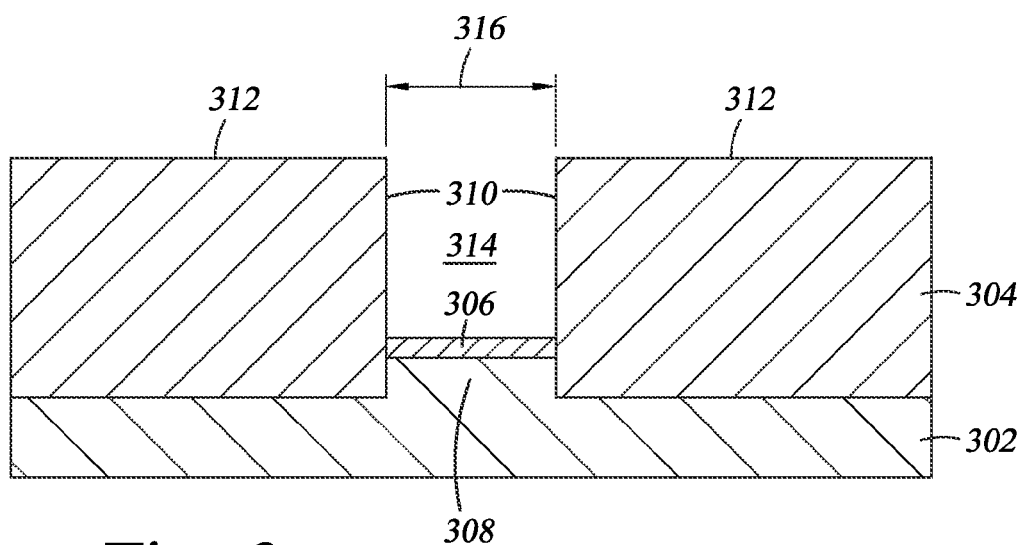
FIG. 3 illustrates a partial, cross-sectional view of a substrate after a first plasma process.

FIG. 3 illustrates a partial, cross-sectional view of a substrate 302 having a fin structure 308 and an STI structure 304 formed thereon. The fin structure 308 may be fin field effect transistor (FinFET) structure in one embodiment or may be a portion of a FinFET structure. The substrate 302 and fin structure 308 may be formed from the same material, such as a silicon containing material, for example, polycrystalline silicon. The substrate 302 may also be modified by various doping processes to form n and p wells for CMOS device formation. The fin structure 308 may have a first width 316 which may be suitable for forming sub-10 nm node device structures.

The STI structure 304 may be an oxide containing structure and may be formed from a material such as oxynitride or the like. The STI structure 304 may be disposed on and contact the substrate 302 adjacent the fin structure 308. The STI structure 304 may have a top surface 312 and sidewalls 310 which define a recess 314. The sidewalls 310 may be disposed vertically adjacent the fin structure 308 and the width of the recess 314 may be similar to the first width 316.

A native oxide layer 306 may also be formed on the fin structure 308. The native oxide layer 306 may be formed by exposure to atmosphere during a substrate transfer process. For example, the substrate 302 may be transferred from a processing chamber to which deposited the STI structure 304 to a material removal chamber, such as the process chamber 100. During transfer between vacuum environments, oxygen in the atmosphere may react with an exposed silicon surface (i.e. the fin structure) and the native oxide layer 306 may form on the fin structure 308. In one embodiment, the native oxide layer 306 is a silicon dioxide material.

The substrate 302 illustrated in FIG. 3 represents the substrate condition upon placement in the plasma processing chamber 100 after operation 210. A first plasma process, such as operation 220, may be performed to prepare the substrate 302 for subsequent processes. In one embodiment, the first plasma process may be a material modification process utilizing an oxygen containing plasma. It is believed that an oxide deposition process utilized to form the STI structure 304 may result in surfaces, such as the sidewalls 310 and the top surface 312, which are fluorine terminated. In one embodiment, the STI structure 304 may be fluorine terminated silicon dioxide ($SiO_2$). The fluorine terminated surface are readily reactive with various process gases, such as those process gases which may be utilized in operation 240. However, the reactive properties of the fluorine terminated silicon dioxide are generally undesirable when selective etching processes are necessary to clean and prepare the substrate 302 for a replacement fin structure or channel formation process.

In one embodiment, an oxygen containing plasma is formed in the process chamber 100 to selectively modify the surfaces (sidewalls 310 and top surface 312) of the STI structure 304. It is believed that the oxygen plasma process predominantly reacts with the fluorine present on the surface of the STI structure 304 while results in the formation of silicon tetrafluoride ($SiF_4$). The silicon tetrafluoride may be a volatile species and may be removed from the STI structure 304 under appropriate processing conditions. The resulting surfaces of the STI structure 304 may be substantially free of fluorine and may be predominantly oxygen terminated. It should be noted that the oxygen containing plasma is predominantly unreactive with the native oxide layer 306 such that the plasma process primarily modifies the STI structure 304.

In one embodiment, oxygen process may be energized into an oxygen containing plasma to modify the surfaces of the STI structure 304. A source power of between about 400 W and about 800 W, such as between about 500 W and about 750 W, may be utilized to energize the oxygen process gas. The source power may be one of several types, including radio frequency (RF), direct current (DC), alternating current (AC) or microwave (MW) based power. In one example, the oxygen containing plasma may be an inductively coupled plasma. The STI surface modification process may be performed with a continuous mode plasma or a pulsed plasma and may proceed for an amount of time between about 30 seconds and about 240 second.

It is believed that the oxygen containing plasma modification process may remove some material ($SiF_4$) from the STI structure 304, such as between about 10 Å and about 15 Å, for example, about 12 Å. The material removed may be evacuated from the process chamber 100 by the pumping system 128. However, it has been found that the amount of material removed is substantially constant utilizing the oxygen containing plasma with a source power of between about 500 W and about 750 W for a time interval of between about 30 seconds and about 240 seconds. Thus, the STI structure surface modification may result in predominantly oxygen terminated sidewalls 310 and top surface 312.

Figure 4:
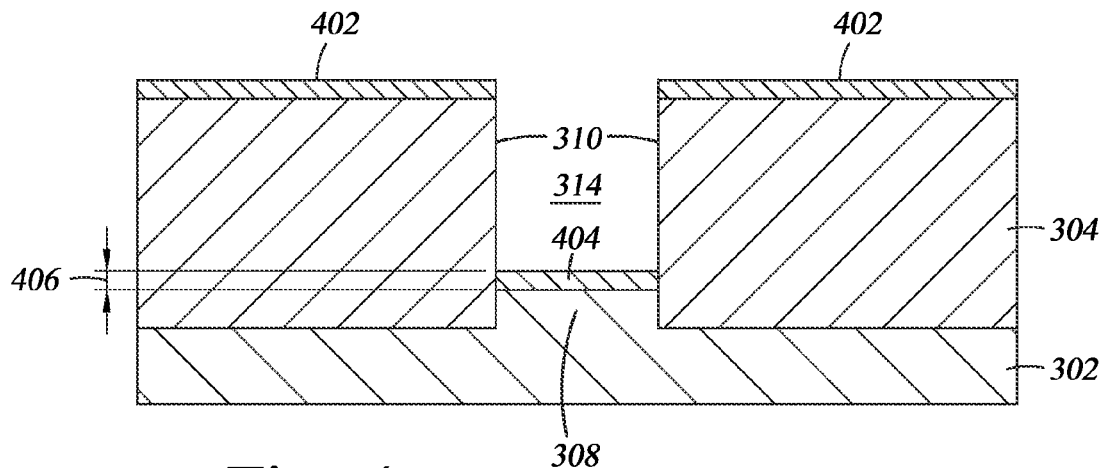
FIG. 4 illustrates a partial, cross-sectional view of a substrate after a second plasma process.

FIG. 4 illustrates a partial, cross-sectional view of the substrate 302 after a second plasma process. The second plasma process may be an argon containing plasma process which is configured to be directional in nature. The directionality of the argon containing plasma process may enable selective modification of desired surfaces on the substrate 302. For example, the top surface 312 of the STI structure and the native oxide layer 306 (See FIG. 3) may be modified.

In one embodiment, argon gas is provided to the process chamber 100 and energized into a plasma. A source power of between about 500 W and about 1500 W, such as about 1000 W, may be utilized in conjunction with a bias of between about 20 W and about 60 W, such as about 40 W, to form a directional argon plasma. The argon plasma may anisotropically modify the top surface 312 and the native oxide layer 306 to form modified layers 402, 404. It is believed that the bonds between the silicon and oxygen comprising the STI structure modified surfaces and the native oxide layer 306 are weakened or broken to create dangling bonds. Thus, the modified layers 402, 404 substantially comprise silicon and oxygen dangling bonds. A thickness 406 of the modified layer 404 may be between about 3 Å and about 8 Å, such as about 5 Å or about 6 Å.

Figure 5:
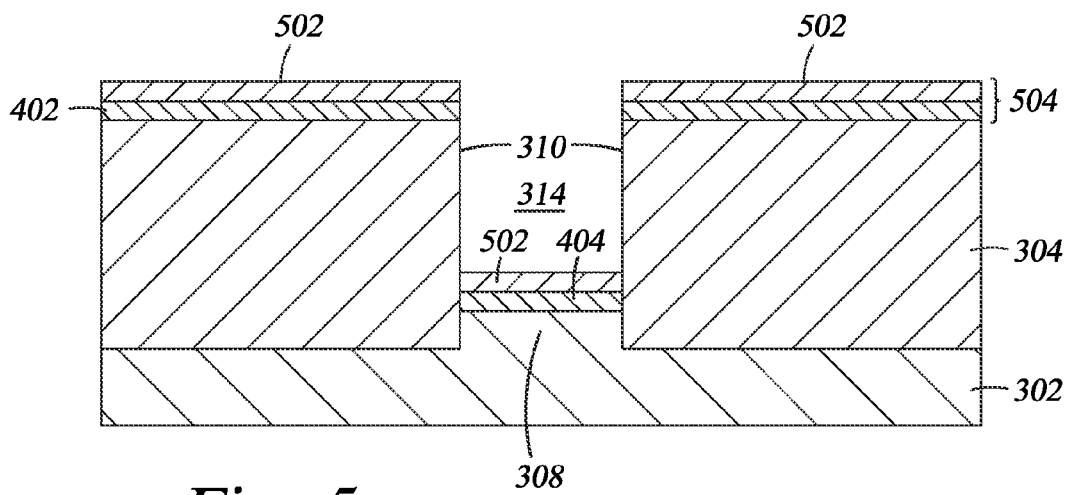
FIG. 5 illustrates a partial, cross-sectional view of a substrate after a third plasma process.

FIG. 5 illustrates a partial, cross-sectional view of the substrate 302 after a third plasma process. An etching gas mixture may be introduced to the process chamber 100 for selectively removing desired material, such as the modified layers 402, 404 from surfaces of the substrate 302. In one embodiment, ammonia and nitrogen trifluoride process gases are introduced into the process chamber 100 to form the third plasma. The amount of each gas introduced into the chamber 100 is variable and may be adjusted to accommodate, for example, the thickness of the modified layers 402, 404 to be removed, the geometry of the surfaces to be cleaned, the volume capacity of the chamber body 102, and the capabilities of the pumping system 128.

The ratio of the third plasma process gases may be predetermined to selectively remove the modified layers 402, 404 from the STI structure 304 and the fin structure 308, respectively. In one example, the gases are introduced to provide a gas mixture having at least a 1:1 molar ratio of ammonia to nitrogen trifluoride. The process gas mixture may be provided at a molar ratio of between about 5:1 (ammonia to nitrogen trifluoride) and about 30:1 (ammonia to nitrogen trifluoride), such as between about 10:1 (ammonia to nitrogen trifluoride) and about 20:1 (ammonia to nitrogen trifluoride).

A purge gas or carrier gas may also be added to the third plasma process gas mixture. Any suitable purge/carrier gas may be utilized, such as argon, helium, hydrogen, nitrogen, and combinations and mixtures thereof. Typically, the overall process gas mixture is between about 0.05% and about 20% by volume of ammonia and nitrogen trifluoride. The remainder is the purge/carrier gas.

The operating pressure within the chamber body 102 may be variable and may typically be maintained between about 500 mTorr and about 30 Torr. For example, the pressure may be between about 1 Torr and about 10 Torr. An RF power may be utilized to form the third plasma, which may be an inductively coupled plasma. The RF power may be between about 5 W and about 600 W to energize the process gases. The frequency with which the RF power is applied may be less than about 100 kHz.

The plasma energy dissociates the ammonia and nitrogen trifluoride gases into reactive species that combine to form a reactive ammonia fluoride ($NH_4F$) compound and/or ammonium hydrogen fluoride ($NH_4F.HF$) in the gas phase. The reactive species are directed toward the substrate 302 in the process chamber 100 to react with the modified layers 402, 404. The reactive species, such as $NH_4F$, is depicted as being deposited as a thin layer 502 over the modified layers 402, 404 for illustrative purposes. It is believed that the reactive species interacts with the modified layers 402, 404 to form a solid byproduct. Thus, the reactive species may contact the modified layers 402, 404 and react with the materials comprising the modified layers 402, 404. In one embodiment, the thin layer 502 may be a temporarily formed material prior to formation of the solid byproduct. In this embodiment, the third plasma process may not form a distinct layer, rather, a volatilizable material, such as the solid byproduct may be formed. The third plasma process may be performed at a temperature of between about 40° C. and about 80° C., such as between about 50° C. and about 70° C. It is believed that the material of the STI structure sidewalls 310 are substantially unreactive with the ammonia fluoride plasma at temperatures greater than about 50° C., which results in selective deposition/interaction of the thin layer 502 on the modified layers 402, 404 as opposed to the sidewalls 310.

Not wishing to be bound by theory, it is believed that the reactive species of the third plasma react with the silicon oxide surface of the modified layers 402, 404 to form ammonium hexafluorosilicate $(NH_4)_2SiF_6$, $NH_3$, and $H_2O$ products. The $NH_3$ and $H_2O$ are vapors at processing conditions and are removed from the chamber 100 by the pumping system 128. The $(NH_4)_2SiF_6$ is a solid byproduct in certain embodiments. The combination of the modified layers 402, 404 and the thin layer 502 may be considered a reaction product 504, such as the solid byproduct described above. In one embodiment, a thickness of the reaction product 504 may increase by a factor of between about 2 and about 4, such as about 3. Ultimately the reaction product 504 is removed as described in greater detail with regard to FIG. 6.

Figure 6:
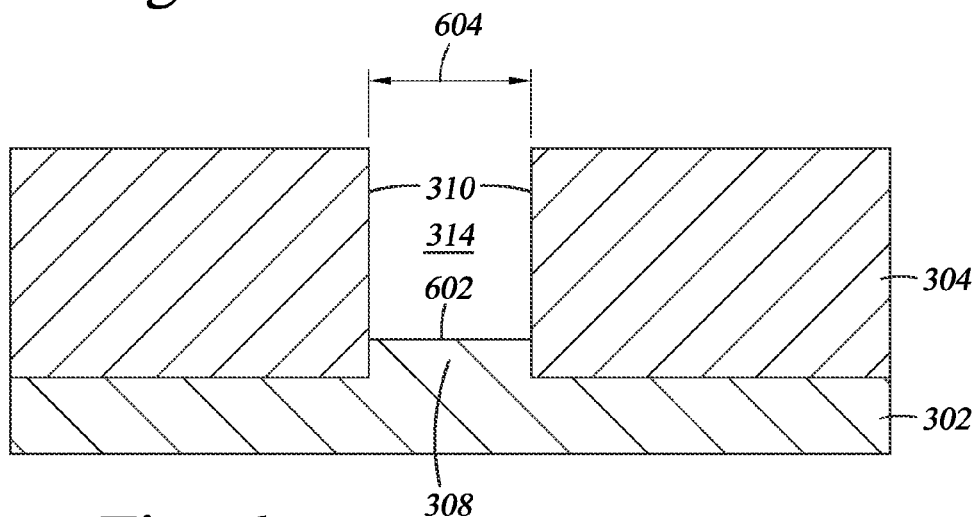
FIG. 6 illustrates a partial, cross-sectional view of a substrate after a material removal process.

FIG. 6 illustrates a partial, cross-sectional view of the substrate 302 after a material removal process. In one embodiment, the substrate 302 may be heated in the process chamber 100 to a temperature greater than about 120° C. As a result of the heating process, the reaction product 504 may be removed from the substrate 302. The reaction mechanism described in FIGS. 5 and 6 can be summarized as follows:

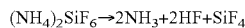

The heating process may dissociate or sublimate the $(NH_4)_2SiF_6$ into volatile $SiF_4$, $NH_3$, and HF products. The volatile products are then removed from the chamber 100 by the pumping system 128.

The result of the aforementioned processes provides a surface 602 of the fin structure 308 which has been cleaned. The cleaned surface may be suitable for subsequent processing in a deposition chamber, such as a high mobility channel formation process. A second width 604 may be greater than the first width 316 by less than about 2 nm. As such, the critical dimensions of the recess 314 may be maintained through the operations of the method 200.

The embodiments described herein provide for a clean silicon surface between a patterned STI structure for subsequent growth of high mobility sub 10 nm node FinFET structures. The selective material modification and etching processes substantially prevent critical dimension blowout while improving throughput by enabling a single chamber cleaning method.

While the foregoing is directed to embodiments of the present disclosure, other and further embodiments of the disclosure may be devised without departing from the basic scope thereof, and the scope thereof is determined by the claims that follow.

What is claimed is:

1. A method of forming a semiconductor device, comprising:
   transferring a substrate having a fin structure and a shallow trench isolation (STI) structure formed thereon in to a plasma processing chamber;
   exposing the substrate to an oxygen containing plasma;
   exposing the substrate to an argon containing plasma;
   exposing the substrate to an ammonia fluoride containing plasma; and
   heating the substrate, wherein a reaction product of the exposing the substrate to an argon containing plasma and the exposing the substrate to an ammonia fluoride containing plasma is removed from the substrate.

2. The method of claim 1, wherein the fin structure is a silicon containing material.

3. The method of claim 2, wherein a native oxide material is formed on the fin structure during the transferring the substrate to the plasma processing chamber.

4. The method of claim 1, wherein the STI structure is an oxide material.

5. The method of claim 1, wherein the exposing the substrate to an oxygen containing plasma forms oxygen terminated surfaces on the STI structure.

6. The method of claim 1, wherein the exposing the substrate to an argon containing plasma is performed from about 30 seconds to about 240 second with a continuous source power of between about 500 W and about 750 W.

7. The method of claim 6, wherein an $O_2$ process gas provided to the plasma processing chamber to form the oxygen containing plasma.

8. The method of claim 7, wherein the exposing the substrate to an oxygen containing plasma removes between about 10 Å and about 15 Å from a top surface and a sidewall of the STI structure.

9. The method of claim 1, wherein the exposing the substrate to an argon containing plasma forms a modified layer comprising silicon and oxygen dangling bonds.

10. The method of claim 1, wherein the exposing the substrate to an ammonia fluoride containing plasma is performed at a temperature of between about 50° C. and about 70° C.

11. The method of claim 1, wherein the reaction product comprises $(NH_4)_2SiF_6$.

12. The method of claim 1, wherein the heating the substrate is performed at a temperature greater than about 120° C.

13. A method of forming a semiconductor device, comprising:
   transferring a substrate having a silicon fin structure and a shallow trench isolation (STI) oxide structure formed thereon in to a plasma processing chamber, wherein a native oxide layer is formed on the silicon fin structure;
   exposing the substrate to an oxygen containing plasma to form oxygen terminated surfaces on the STI oxide structure;
   exposing the substrate to an argon containing plasma to form a modified layer on the substrate;
   exposing the substrate to an ammonia fluoride containing plasma to form a reaction product layer on the substrate; and
   heating the substrate, wherein the reaction product layer is removed from the substrate.

14. The method of claim 13, wherein forming the modified layer on the substrate is performed at a temperature of between about 50° C. and about 70° C.

15. The method of claim 13, wherein the reaction product layer comprises $(NH_4)_2SiF_6$.

16. The method of claim 15, wherein the reaction product layer removal is performed at a temperature of greater than about 120° C.

17. The method of claim 13, wherein a width of recess formed in the STI oxide structure after exposing the substrate to an oxygen containing plasma is increased by less than about 2 nm.

18. A method of forming a semiconductor device, comprising:
   transferring a substrate having a fin structure and a shallow trench isolation (STI) structure formed thereon in to a plasma processing chamber;
   exposing the substrate to a first plasma to modify surfaces of the STI structure;
   exposing the substrate to a second plasma different from the first plasma to form a first layer on the substrate;
   exposing the substrate to a third plasma different from the first plasma and the second plasma to form a second layer on the first layer; and
   heating the substrate, wherein the first layer and second layer are removed from the substrate.

19. The method of claim 18, wherein the first layer is removed from the substrate via a desorption process performed at a temperature of greater than about 120° C.

20. The method of claim 18, wherein a width of a recess formed in the STI structure after exposing the substrate to the first plasma is increased by less than about 2 nm.

* * * * *